United States Patent
Maruyama

(10) Patent No.: US 6,178,121 B1
(45) Date of Patent: Jan. 23, 2001

(54) SEMICONDUCTOR MEMORY DEVICE, SEMICONDUCTOR DEVICE, AND ELECTRONIC APPARATUS USING THE SEMICONDUCTOR DEVICE

(75) Inventor: Akira Maruyama, Nagano (JP)

(73) Assignee: Seiko Epson Corporation, Tokyo (JP)

( * ) Notice: Under 35 U.S.C. 154(b), the term of this patent shall be extended for 0 days.

(21) Appl. No.: 09/367,053

(22) PCT Filed: Dec. 10, 1998

(86) PCT No.: PCT/JP98/05587

§ 371 Date: Sep. 28, 1999

§ 102(e) Date: Sep. 28, 1999

(87) PCT Pub. No.: WO99/30325

PCT Pub. Date: Jun. 17, 1999

(51) Int. Cl.[7] ................................................. G11C 7/00
(52) U.S. Cl. .................................. 365/189.09; 365/149
(58) Field of Search .............................. 365/189.09, 149

(56) References Cited

U.S. PATENT DOCUMENTS 5,274,586 * 12/1993 Matsukawa ............................ 365/149
5,282,167 * 1/1994 Tanaka et al. ....................... 365/206
5,654,913 * 8/1997 Fukushima et al. ................. 365/149
5,734,603 * 3/1998 Tai ........................................ 365/149

FOREIGN PATENT DOCUMENTS 4-92285 3/1992 (JP).
6-20467 1/1994 (JP).

* cited by examiner

Primary Examiner—David Nelms
Assistant Examiner—Connie C. Yoha
(74) Attorney, Agent, or Firm—Oliff & Berridge PLC

(57) ABSTRACT

A memory cell (1) with a MOS transistor (5) and a data-storing capacitor (7). One of two input/output electrodes of the MOS transistor (5) is connected to a bit line (36) and a gate electrode is connected to a word line (38). A first electrode (6) of the data-storing capacitor (7) is connected to the other input/output electrode of the MOS transistor (5) and a second electrode (14) is connected to a potential control circuit (40). When the data stored in the memory cell (1) is "HIGH", the potential control circuit (40) changes the potential of the second electrode (14) of the data-storing capacitor (7) from a precharge potential VCC/2 to a ground potential GND after data-writing and data-readout operations are completed. When the data stored in the memory cell (1) is "LOW", the potential control circuit (40) changes the potential of the second electrode (14) of the data-storing capacitor (7) from the precharge potential VCC/2 to a power potential VCC after data-writing and data-readout operations are completed.

16 Claims, 7 Drawing Sheets

SEMICONDUCTOR MEMORY DEVICE, SEMICONDUCTOR DEVICE, AND ELECTRONIC APPARATUS USING THE SEMICONDUCTOR DEVICE

TECHNICAL FIELD

The present invention relates to a semiconductor memory device such as a DRAM (dynamic random access memory), a semiconductor device, and an electronic instrument using the semiconductor device, and more particularly to control of the potential of the cell plate of a memory cell transistor.

BACKGROUND ART

FIG. 6 shows a memory cell array of a conventional DRAM. In FIG. 6, memory cells 1–4 are provided with N-type MOS transistors (hereinafter called "NMOS transistor") 5, 8, 10, and 12 and data-storing capacitors 7, 9, 11, and 13, respectively. Bit lines 36 and 37 and word lines 38–41 are connected to the memory cells 1–4. A potential VCC/2 which is the half the power potential VCC is applied to a cell plate electrode 14. A sense amplifier circuit 21 comprises P-type MOS transistors (hereinafter called "PMOS transistor") 22–24 and NMOS transistors 25–27. A precharge circuit 32 includes PMOS transistors 33–35. Data to be written in the memory cells 1–4 is input to a data-input circuit 30A, and the data read out from the memory cells 1–4 is amplified by the sense amplifier 21 to be output from a data-output circuit 30B.

FIG. 7 is a timing chart showing an operation of writing data in the memory cell 1 of the DRAM shown in FIG. 6. A signal SPR is grounded to precharge the bit lines 36 and 37 with the potential of VCC/2 before data is written in the memory cell 1. The potential of the word line 38 is changed from the ground potential GND to a high potential VPP to turn on the transistor 5.

At this time, the potential of the bit line 36 changes corresponding to the charge stored in the data-storing capacitor 7. Specifically, when the data "HIGH" has been written in the memory cell 1, the potential of the bit line 36 changes to a potential that is ΔV1 lower than the precharge potential VCC/2 as shown by the solid line in FIG. 7. As a result, the potential of a node 6 changes to a potential that is ΔV2 lower than the potential VCC/2 as shown by the broken line in FIG. 7. When the data "LOW" has been written in the memory cell 1, the potential of the bit line 36 changes to a potential that is ΔV1 higher than the precharge potential VCC/2 as shown by the broken line in FIG. 7. This results in the potential of the node 6 changing to a potential that is ΔV2 higher than the potential VCC/2 as shown by the solid line in FIG. 7.

The data-input circuit 30 sets the potential of the bit line 36 at the power potential VCC (or ground potential GND) in response to the data-input signal. In this case, the bit line 37 is at the ground potential GND (or power potential VCC). When the potential of the bit line 36 is set at the power potential VCC, a charge with the power potential VCC (the node 6 is at VCC) is stored in the data-storing capacitor 7. Therefore, the data "HIGH" is written in the memory cell 1. When the potential of the bit line 36 is set at the ground potential GND, a charge with the ground potential GND (the node 6 is at GND) is stored in the data-storing capacitor 7. Therefore, the data "LOW" is written in the memory cell 1.

Since each of the word lines 39–41 in the memory cell transistors 2–4 is at the ground potential GND, no writing operation is performed if the transistors 8, 10, and 12 are turned off.

FIG. 8 is a timing chart showing an operation of reading out data from the memory cell 1 of the DRAM shown in FIG. 6. In the data-readout operation shown in FIG. 8, only points differing from the data-writing operation shown in FIG. 7 will be described.

In the readout operation shown in FIG. 8, after the potential of the word line 38 is raised from the ground potential GND to a high potential VPP, the potential of a signal SSA is raised from the ground potential GND to the power potential VCC. At this time, the sense amplifier 21 amplifies the potential of the bit line 36 up to the power potential VCC (or ground potential GND) to read out data. In this case, the potential of the bit line 37 is amplified up to the ground potential GND (or power potential VCC). At the same time, the potential of the node 6 returns to the power potential VCC (or ground potential GND) to conduct a refresh operation.

In the memory cells 2–4, no data-readout operation is performed if each of the word lines 39–41 is at the ground potential GND and the transistors 8, 10, and 12 are turned off.

In this prior art, a cell plate electrode 14 is at a constant potential as high as VCC/2 and the node 6 is at the power potential VCC or at the ground potential GND after writing and readout operations. Therefore, variation in the potential of the bit line 36 is small, both in a readout operation after a write-operation and in a continuous readout operation.

A variation ΔV1 in the potential of the bit line 36 is represented by the following equation (1) or (2) on the premise that the capacitance of the memory cell 1 is Cmc and the load on the bit line 36 is Cbl.

$$\Delta V1 = f(Cmc, Cbl) \times (VCC - Vcc/2) \quad (1)$$

$$\Delta V1 = f(Cmc, Cbl) \times (GND - Vcc/2) \quad (2)$$

The function f(Cmc, Cbl) in the above equation (1) is given by the following equation (3).

$$f(Cmc, Cbl) = 1/[1 + (Cbl/Cmc)] \quad (3)$$

The load capacitance Cbl on the bit line 36 increases with an increase in the number of memory cells connected to the bit line 36. In this case, the potential variation ΔV1 of the bit line 36 decreases from the equations (1)–(3). In order to avoid this phenomenon, measures may be taken in which the bit line 36 is divided in the longitudinal direction of FIG. 6 to shorten the length per line. However, the number of sense amplifiers 21 increases in proportion to the number of divided bit lines, thereby increasing the area of a semiconductor memory device in a semiconductor device.

Such a small potential variation ΔV1 of the bit line 36 causes unstable performance of the sense amplifier 21 due to noises and the like. This also hinders high speed access to a memory because of a time-consuming operation of the sense amplifier 21. Moreover, if the power voltage is made lower using prior art technology to reduce power dissipation, the potential variation ΔV1 of the bit line is further decreased, whereby it is impossible to perform an operation at low voltages.

An object of the present invention is to provide a semiconductor memory device which is improved in the noise immunity of a sense amplifier and can attain high speed performance of a sense amplifier, a semiconductor device, and an electronic instrument using the same.

A further object of the present invention is to provide a semiconductor memory device which can reduce power dissipation, a semiconductor device, an electronic instrument using the same.

DISCLOSURE OF THE INVENTION

A semiconductor memory device according to the present invention comprises:
- a plurality of word lines;
- a plurality of bit line pairs;
- a plurality of memory cells, each of the memory cells being connected to one of the word lines and also to one of the bit line pairs;
- a plurality of potential-control circuits; and
- a plurality of sense amplifiers which amplify data read-out from the plurality of memory cells through the plurality of bit line pairs to output the amplified data;

wherein each of the memory cells comprises:
- a transistor comprising a control electrode and two input/output electrodes, the control electrode being connected to one of the word lines, and one of the input/output electrodes being connected to a bit line of one of the bit line pairs; and
- a data-storing capacitor comprising first and second electrodes, the first electrode being connected to the other of the input/output electrodes of the transistor, and the second electrode being connected to one of the potential control circuits;

wherein each of the plurality of potential control circuits changes the potential of the second electrode of the data-storing capacitor based on data stored in a memory cell in the plurality of memory cells after data-writing and data-reading operations for the memory cell has been completed.

In the present invention, when each data-writing and data-reading operation is completed, the potential of the second electrode (which is also called "cell plate electrode") of the data-storing capacitor in the memory cell is changed by the potential control circuit. As a result, the potential of the first electrode of the data-storing capacitor can be raised or dropped, whereby the potential of the first electrode of the data-storing capacitor is higher or lower than that used in conventional systems. Therefore, the potential variation of the bit line is increased both in a readout operation after a writing operation and in a continuous readout operation. As a result, the noise immunity of the sense amplifier is improved, thereby enabling stable operation. The operation speed of the sense amplifier becomes higher, thereby enabling high speed readout operation. Furthermore, potential variation of the bit line is secured at a certain level even if the power potential is low, thereby enabling operation at low voltages.

Since the potential of the data-storing capacitor is higher or lower than in conventional systems, the data-storing characteristics of the memory cell can be improved.

Each of the potential control circuits may be provided for one group of the memory cells among the plurality of memory cells, when the one group of the memory cells is commonly connected to one of the bit line pairs.

Because of this, an increase in the area occupied by a circuit pattern on the semiconductor substrate can be limited since only one potential control circuit is provided for each pair of bit lines.

After the potential of the second electrode has been changed and one of the word lines connected to the memory cell has been brought to an unselected condition, each of the potential control circuits may return the value of the potential of the second electrode to the value before the change.

Because of this, the data value stored in the memory cell connected to the pair of bit lines is not changed.

Each of the potential control circuits may control the potential of the second electrode of the data-storing capacitor only when the data stored in the memory cell is "HIGH".

This is because strict refresh characteristics (storing characteristics) after the data-readout operation are required when the data written in the memory cell is "HIGH".

Each of the potential control circuits may control the potential of the second electrode of the data-storing capacitor so that the value of the potential of the second electrode that is set when the data stored in the memory cell is "HIGH" is different from the value of the potential of the second electrode that is set when the data stored in the memory cell is "LOW". In this case, when the data stored in the memory cell is "HIGH", each of the potential control circuits can set the potential of the second electrode of the data-storing capacitor to be less than a given value. When the data stored in the memory cell is "LOW", each of the potential control circuits can set the potential of the second electrode of the data-storing capacitor to be higher than a given value.

For example, if a data potential at the time when the data stored in the memory cell is "HIGH" is a power potential VCC, and if a data potential at the time when the data stored in the memory cell is "LOW" is a ground potential GND, each of the potential control circuits may set the potential of the second electrode of the data-storing capacitor to be the ground potential GND after the writing and reading operations of the "HIGH" data for the memory cell have been completed, and each of the potential control circuits may set the potential of the second electrode of the data-storing capacitor to be VCC/2 except when the writing and reading operations have been completed.

In the above condition, each of the potential control circuits may set the potential of the second electrode of the data-storing capacitor to be the power potential VCC after the writing and reading operations of the "LOW" data for the memory cell have been completed, and each of the potential control circuits may set the potential of the second electrode of the data-storing capacitor to be VCC/2 except when the writing and reading operations have been completed. A potential that is supplied to the control electrode of the transistor that is connected to one of the word lines may be set to be less than $-VCC/2$ when the one of the word lines is not selected. This ensures that the transistor of the memory cell connected to the word line is not inadvertently turned on when the word line is unselected.

Each of the potential control circuits may comprise: a first switching circuit that is switched based on a control signal that becomes active after the writing and reading operations of data for the memory cell has been completed; and a second switching circuit that is switched based on a data potential stored in the memory cell. The second switching circuit may be connected to one of the bit line pairs, for example.

Two semiconductor structures can be given as a structure to which the present invention can be applied. One of these structures is a stacked capacitor cell structure. In this structure, each of the plurality of memory cells is formed by stacking the first and second electrodes of the data-storing capacitor, and an insulating layer between the first and second electrodes. Another structure is a trench capacitor cell structure. In this structure, each of the plurality of memory cells is formed by arranging the first electrode of the data-storing capacitor, an insulating layer, and the second electrode of the data-storing capacitor along a trench formed on a semiconductor substrate.

The present invention can be applied to a semiconductor device in which the above-described semiconductor memory device is formed on a semiconductor substrate and to an electronic instrument comprising such semiconductor device.

BEST MODE FOR CARRYING OUT THE INVENTION

(Description of Example of Device)

Figure 1:
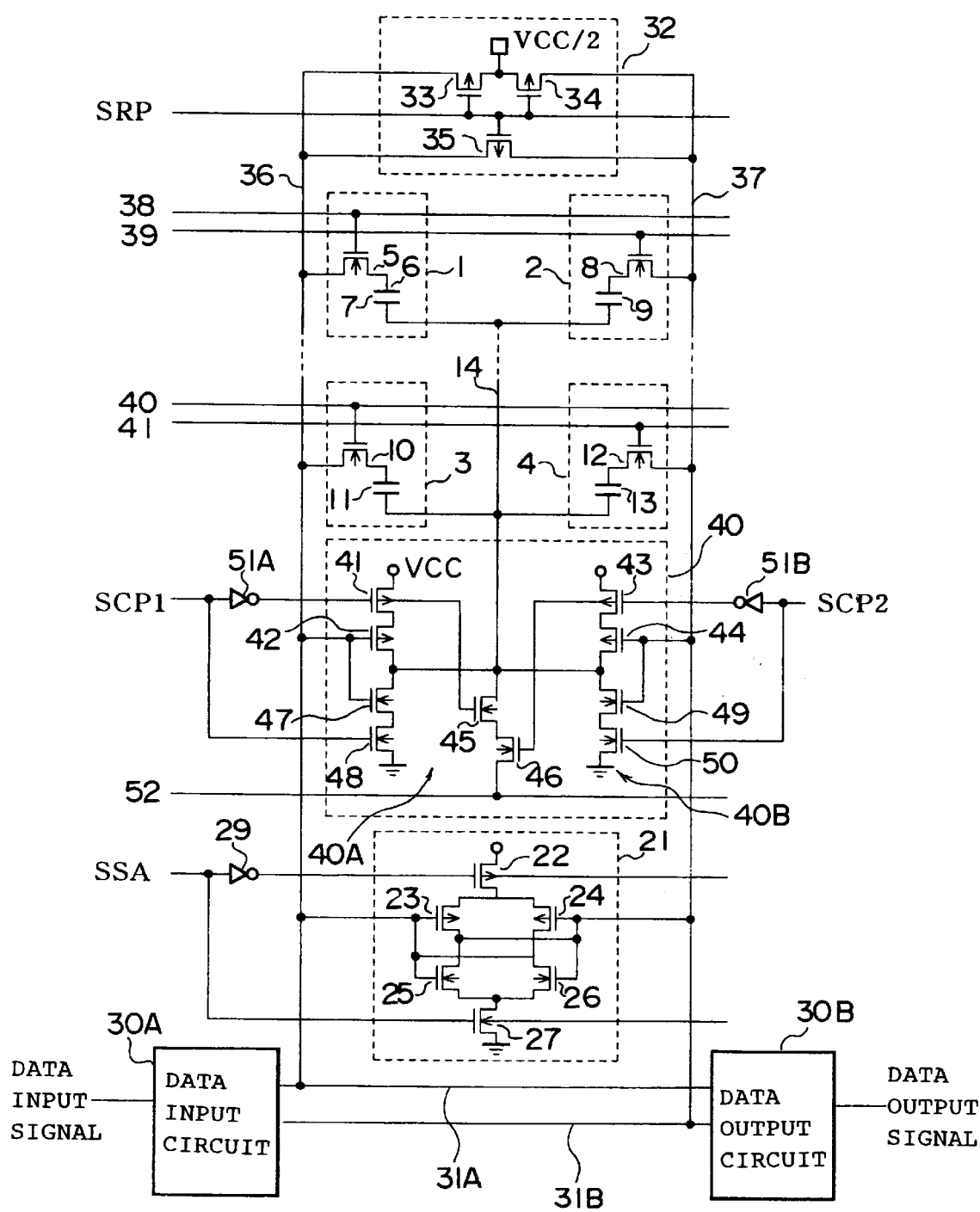
FIG. 1 is a circuit diagram of a semiconductor memory device according to an embodiment of the present invention.
Figure 6:
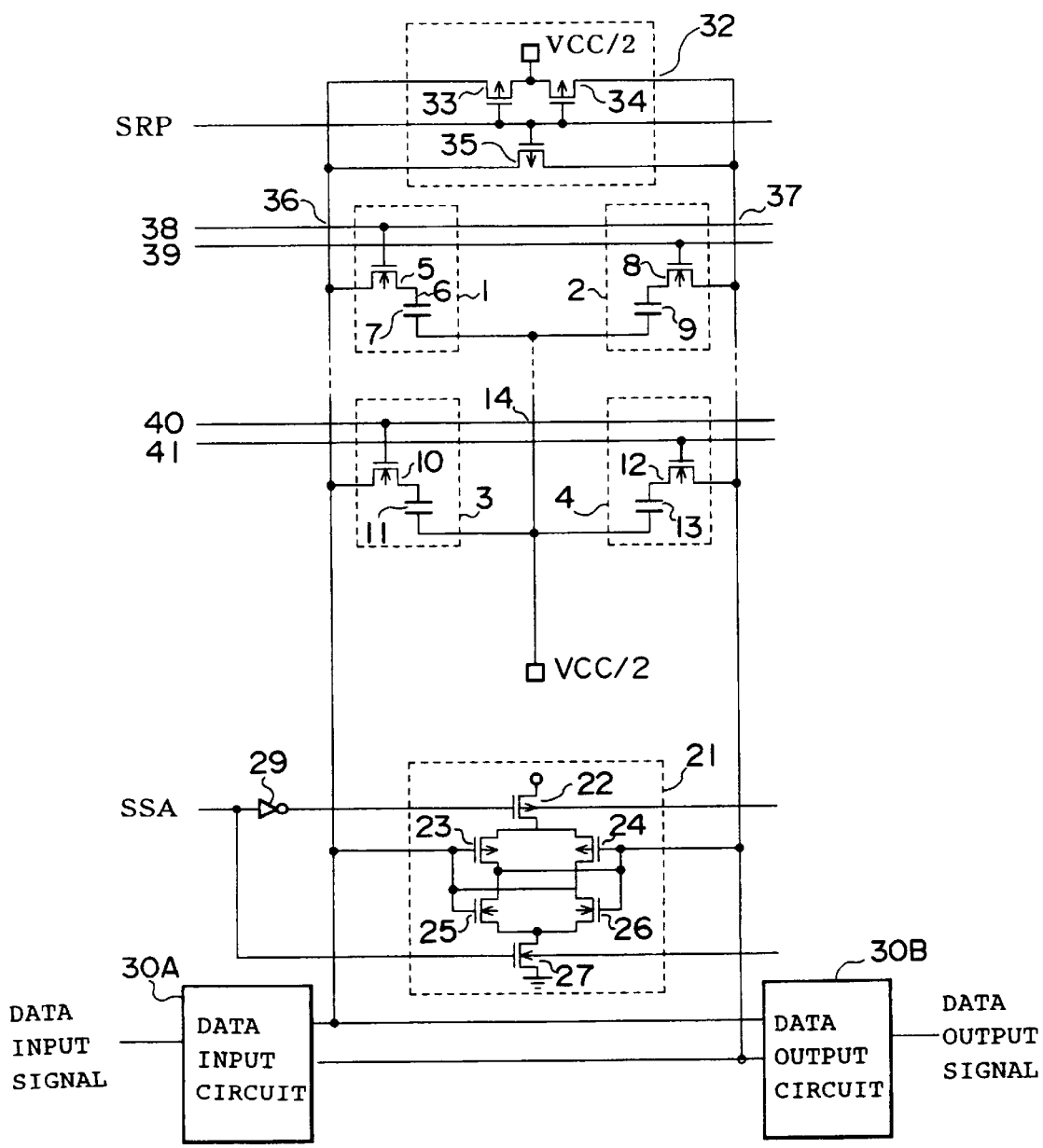
FIG. 6 is a circuit diagram of a conventional semiconductor memory device.
Figure 7:
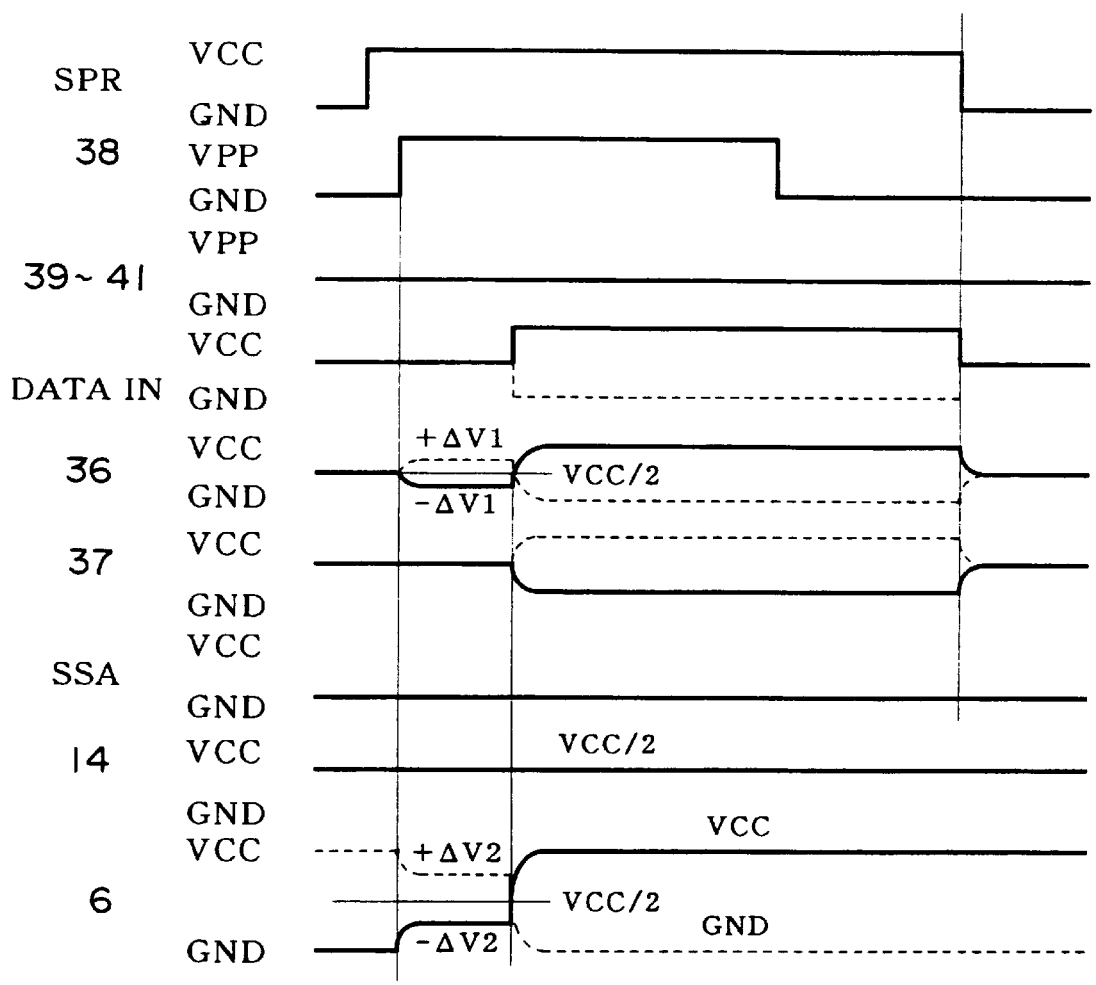
FIG. 7 is a timing chart for describing a data-writing operation in the semiconductor memory device shown in FIG. 6.
Figure 8:
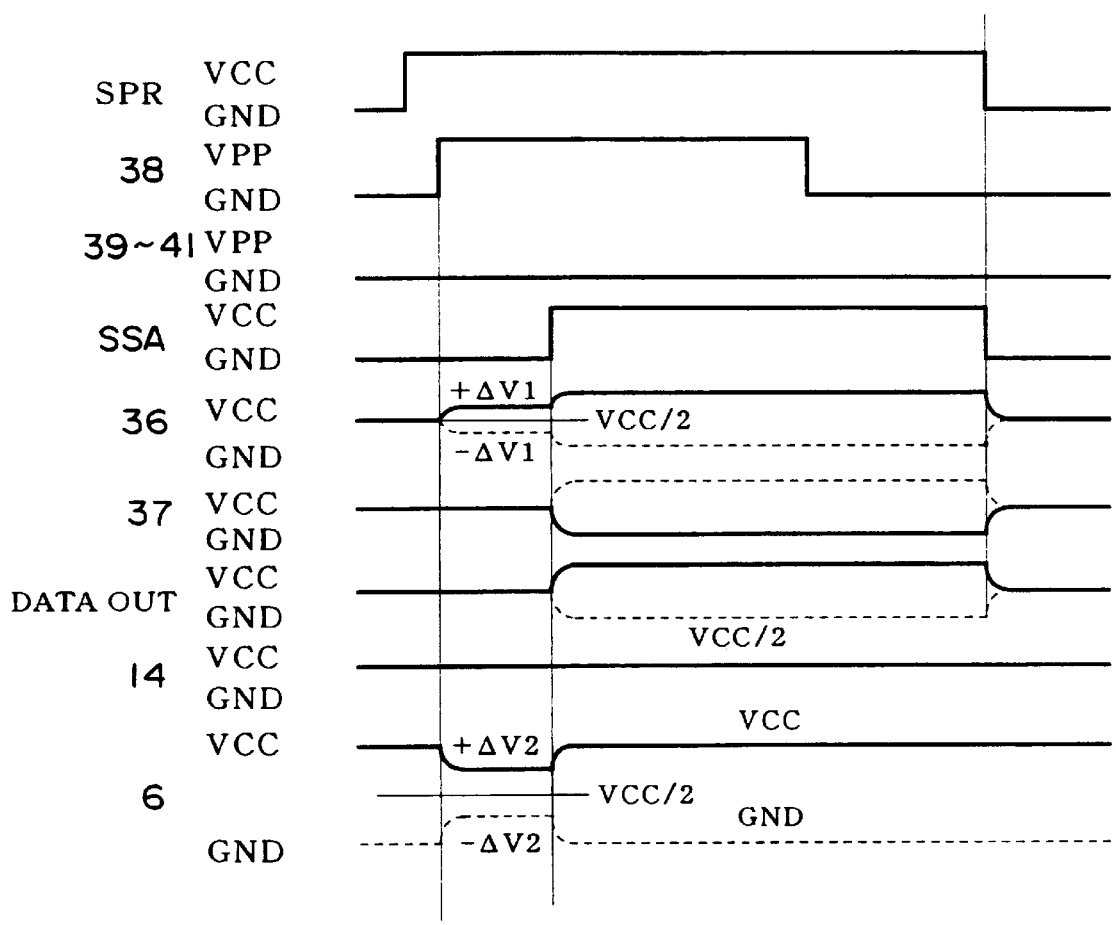
FIG. 8 is a timing chart for describing a data-readout operation in the semiconductor memory device shown in FIG. 6.

FIG. 1 shows an example of a memory cell array of a DRAM as a semiconductor memory device according to the present invention. Among the parts shown in FIG. 1, parts having the same function as the parts shown in FIG. 6 are represented by the same reference numbers.

FIG. 1 shows four memory cells 1–4 in the memory cell array. These memory cells 1–4 are connected to word lines 38–41 respectively. The memory cells 1 and 3 are connected to a common bit line 36 and the memory cells 2 and 4 are connected to a common bit line 37.

The memory cell 1 has an NMOS transistor 5 and a data-storing capacitor 7. The memory cell 2 has an NMOS transistor 8 and data-storing capacitor 9, the memory cell 3 has an NMOS transistor 10 and data-storing capacitor 11, and the memory cell 4 has an NMOS transistor 12 and data-storing capacitor 13.

The above structure will be described taking the memory cell 1 as an example. The NMOS transistor 5 of the memory cell 1 comprises a gate electrode (control electrode) and drain and source electrodes (two input/output electrodes). The gate electrode is connected to the word line 38. One of the source and drain electrodes is connected to the bit line 36 and the other electrode is connected to a first electrode (the upper electrode in FIG. 1) of the data-storing capacitor 7. The potential of the first electrode of the data-storing capacitor 7 is shown later as the potential of a node 6. The potential of each second electrode (cell plate electrode) of the data-storing capacitors 7, 9, 11, and 13 is shown later as the potential of a node 14.

A sense amplifier circuit 21 which is shared by the memory cells 1–4 comprises PMOS transistors 22–24 and NMOS transistors 25–27. A precharge circuit 32 which is shared by a pair of bit lines 36 and 37 comprises PMOS transistors 33–35. The bit lines 36 and 37 are connected to bus lines 31A, 31B respectively. A data-input circuit 30A and a data-output circuit 30B are connected to these bus lines 31A and 31B. A data-input signal is input to the data-input circuit 30A and a data-output signal is output from the data-output circuit 30B.

A potential control circuit 40 is arranged to set and control the potential of the node 14 of the data-storing capacitors 7, 9, 11, and 13, which is a characteristic structure of this example. The potential control circuit 40 is substantially divided into two circuits 40A, 40B. The potential control circuit 40A controls the potential of the node 14 of he two memory cells 1 and 3 which are connected to the bit line 36. The potential control circuit 40A controls the potential of the node 14 on the basis of the data stored in the memory cell 1 or 3 when each of data-writing and data-reading operations performed in one memory cell 1 or 3 among the memory cells connected to the bit line 36 is completed. The potential control circuit 40B likewise controls the potential of the node 14 of the two memory cells 2 and 4 which are connected to the bit line 37.

The potential control circuit 40A comprises PMOS transistors 41 and 42 and NMOS transistors 45–48. The potential control circuit 40B comprises PMOS transistors 43 and 44 and NMOS transistors 45, 46, 49, and 50.

The above structure will be described taking the potential control circuit 40A as an example. The PMOS transistors 41 and 42 and the NMOS transistors 47 and 48 are connected in series between a VCC terminal and the ground. The NMOS transistors 45 and 46 are connected in series between the node 14 and a line 52 set at a constant cell plate potential. In this example, a potential VCC/2 which is half the power potential VCC is applied to the line 52.

The PMOS transistor 41 and NMOS transistors 45 and 48 of the potential control circuit 40A constitute a first switching circuit which is subjected to on/off control by a first control signal SCP1. In more detail, the first control signal SPC1 is input to a gate electrode of the PMOS 41 after being reversed by an inverter 51A. The gate electrode of the NMOS transistor 45 is connected to the PMOS transistor 41 and hence the NMOS transistor 45 is also subjected to on/off control by the first signal SCP1. The first control signal SPC1 is input to a gate electrode of the NMOS transistor 48. A second control signal SPC2 which becomes active at a timing that differs from that of the first signal SPC1 is input to the potential control circuit 40B. An inverter 51B is provided to reverse the second control signal SPC2. The NMOS transistor 46 is shared by the potential control circuits 40A and 40B and subjected to on/off control by the second control signal SPC2.

The PMOS transistor 42 and NMOS transistor 47 of the potential control circuit 40A are connected to the bit line 36 through respective gate electrodes of these transistors. These transistors 42 and 47 therefore constitute a second switching circuit which is subjected to on/off control on the basis of the data potential of the memory cell 1.

Description of Writing Operation

Figure 2:
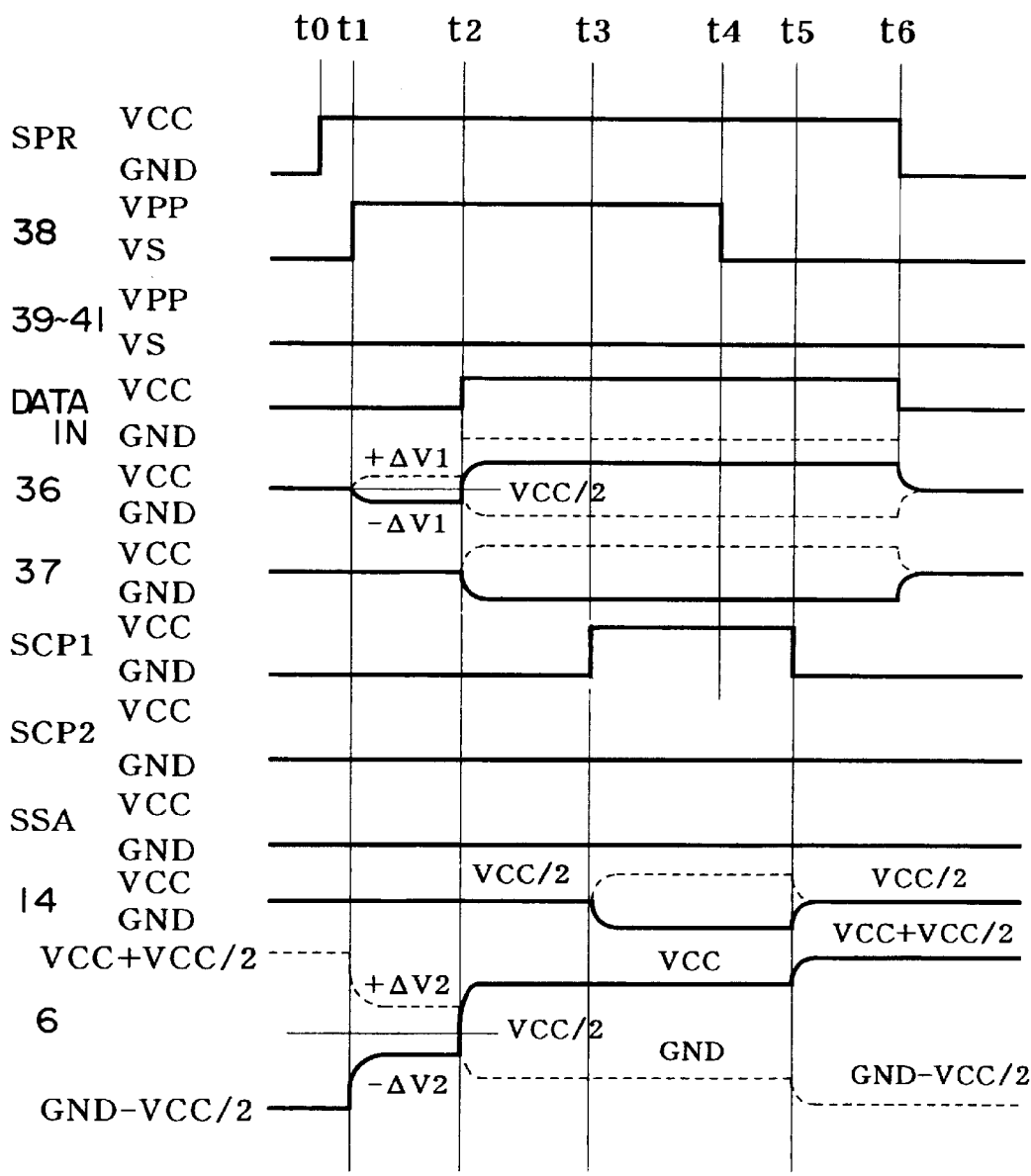
FIG. 2 is a timing chart for describing a data-writing operation in the semiconductor memory device shown in FIG. 1.

FIG. 2 is a timing chart for describing a data-writing operation in the DRAM shown in FIG. 1. Prior to an operation of writing data in the memory cell 1, the potential of a signal SPR to be input to a precharge circuit 32 is kept at the ground potential GND up to a timing t0 as shown in FIG. 2, and the bit lines 36 and 37 are precharged so that these bit lines are at the potential VCC/2. Then, at the timing t0, the signal SPR is raised to the power potential VCC to complete the precharge operation.

When data is written in the memory cell 1, the potential of the word line 38 is changed from the low potential VS to the high potential VPP as shown in FIG. 2. In this example, a negative potential lower than −VCC/2 is used rather than the ground potential GND for reasons described later.

When the potential of the word line 38 is set at the high potential VPP at a timing t1 shown in FIG. 2, the transistor 5 is turned on. Because of this, the potential of the bit line 36 varies in accordance with the charge stored in the data-storing capacitor 7. Specifically, in the case where the data "HIGH" has been written in the memory cell 1, the potential of the bit line 36 is changed to a potential that is ΔV1 higher than the precharge potential VCC/2 as shown by the broken line in FIG. 2. As a result, the potential of the node 6 is changed to a potential that is ΔV2 higher than the potential VCC/2 as shown by the broken line in FIG. 2. On the other hand, in the case where the data "LOW" has been written in the memory cell 1, the potential of the bit line 36 is changed to a potential that is ΔV1 lower than the precharge potential VCC/2 as shown by the solid line in FIG. 2. As a result, the potential of the node 6 is changed to a potential that is ΔV2 lower than the potential VCC/2 as shown by the solid line in FIG. 2.

At a timing t2 of FIG. 2, the data-input circuit 30A set the potential of the bit line 36 at the data potential on the basis of a data-input signal. When the data is "HIGH", the potential of the bit line 36 is set at the power potential VCC. When the data is "LOW", the potential of the bit line 36 is set at the ground potential GND.

When the potential of the bit line 36 is set at the power potential VCC, the charge with the power potential VCC is stored in the data-storing capacitor 7 of the memory cell 1. This means that the data "HIGH" is written in the memory cell 1. Because of this, the potential of the node 6 is changed to the power potential VCC as shown by the solid line in FIG. 2. On the other hand, when the potential of the bit line 36 is set at the ground potential GND, the charge with the ground potential GND is stored in the data-storing capacitor 7 of the memory cell 1. This means that the data "LOW" is written in the memory cell 1. Because of this, the potential of the node 6 is changed to the ground potential GND as shown by the broken line in FIG. 2.

At a timing t3 while the potential of the word line 38 is VPP, the potential of the first control signal SCP1 is raised from the ground potential GND to the power potential VCC. This results in the PMOS transistor 41 and the NMOS transistor 48 being turned on and the NMOS transistor 45 being turned off.

In the case where the data "HIGH" has been written in the memory cell 1, the PMOS transistor 42 is turned off and the NMOS transistor 47 is turned on. Because of this, the node 14 is electrically conducted to the ground potential GND through the NMOS transistors 47 and 48 and its potential varies as shown by the solid line in FIG. 2.

On the other hand, in the case where the data "LOW" has been written in the memory cell 1, the PMOS transistor 42 is turned on and the NMOS transistor 47 is turned off. At this time, the PMOS transistor 41 and the NMOS transistor 48 are also turned on and the NMOS transistor 45 is turned off since the first control signal SCP1 is "HIGH". Therefore, the node 14 is electrically conducted to the power potential VCC through the PMOS transistors 41 and 42 and its potential varies as shown by the dotted line in FIG. 2.

At a timing t4 shown in FIG. 2, the potential of the word line 38 is dropped to a low potential VS to turn off the NMOS transistor 5 of the memory cell 1.

At a timing t5 shown in FIG. 2, the potential of the first control signal SCPL becomes the ground potential GND.

Comparing with the condition at the timing t3 shown in FIG. 2, the PMOS transistor 41 is switched from on to off, the NMOS transistor 45 is switched from off to on and the NMOS transistor 48 is switched from on to off. As a result, the node 14 is electrically conducted to the line 52 through the NMOS transistors 45 and 46 and the potential of the node 14 becomes VCC/2 as shown in FIG. 2.

When the data "HIGH" has been written in the memory cell 1, the potential of the node 6 is raised to VCC+VCC/2 through the data-storing capacitor 7 as shown by the solid line in FIG. 2. When the data "LOW" has been written in the memory cell 1, the potential of the node 6 is dropped to GND−VCC/2 through the data-storing capacitor 7 as shown by the broken line in FIG. 2.

In this example, the potential of the node 6 can be set at a potential that is VCC/2 higher than the potential VCC of the conventional example after an operation of writing the data "HIGH" is completed. Alternatively, the potential of the node 6 can be set at a potential that is VCC/2 lower than the potential VCC of the conventional example after an operation of writing the data "LOW" is completed.

Then, as shown in FIG. 2, the potential of the signal SPR to be input to the precharge circuit 32 is dropped from the power potential VCC to the ground potential GND to complete a series of operation of writing data in the memory cell 1.

As shown in FIG. 2, the operation of writing data in the memory cells 2–4 is not performed by setting the potential of the word lines 39–41 at a low potential VS and allowing the NMOS transistors 8, 10, and 12 to be off during the operation of writing data in the memory cell 1.

When it is intended to write data in any of the memory cells 2, 3, and 4, the data-writing operation can be performed using the same procedures as in the case of the memory cell 1 if any one of the word lines 39, 40, and 41 and any one of the signals SCP1 and SCP2 are respectively allowed to work.

Description of Readout Operation

Figure 3:
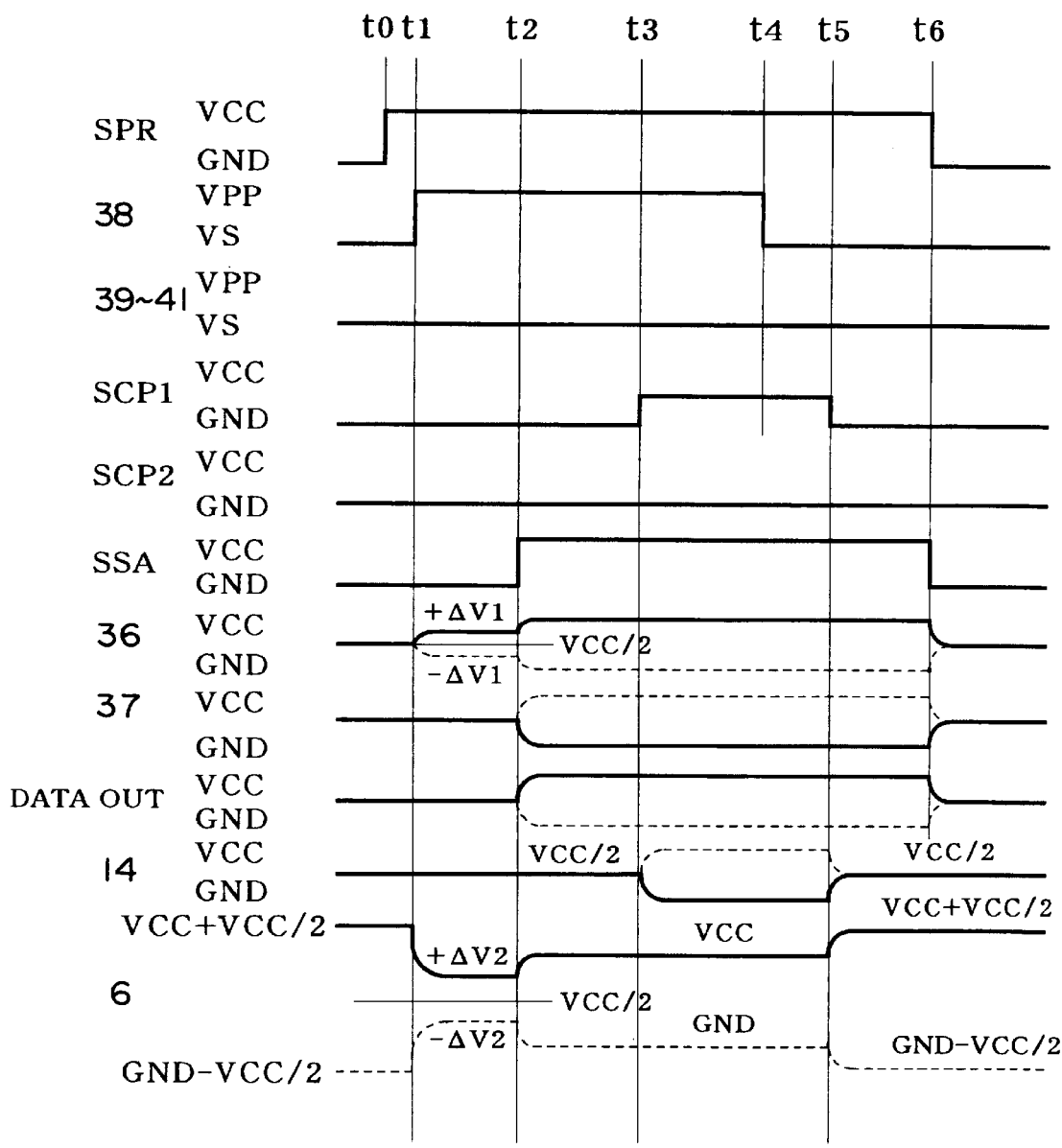
FIG. 3 is a timing chart for describing a data-readout operation in the semiconductor memory device shown in FIG. 1.

The readout operation in the memory cell 1 shown in FIG. 1 will be described with reference to FIG. 3. FIG. 3 is a timing chart showing the data-readout operation in the memory cell 1.

In the case of reading out data from the memory cell 1, the potential of the signal SPC is raised from the ground potential GND to the power potential VCC at a timing t0 as in the data-writing operation shown in FIG. 1. The potential of the word line 38 is then raised from the lower potential VS to the higher potential VPP at a timing t1. By these operations, the bit lines 36 and 37 are precharged to the potential VCC/2 and the NMOS transistor 5 is then turned on.

The reason why the potential of the word line 38 is set at a potential that is VCC/2 lower than the ground potential GND during a period before the timing t1 is as follows. When the data "LOW" has been written in the memory cell 1 in the above-described writing operation, the potential of the node 6 is GND−VCC/2. At this time, if the potential of the word line 38 is set at the ground potential GND as in the conventional system, the NMOS transistor 5 is turned on before the timing t1. To avoid this, the lower potential VS of the word line 38 is set at a potential lower than GND−VCC/2 in this example.

When the NMOS transistor 5 is turned on at the timing t1, the potential of the bit line 36 varies corresponding to the charge stored in the data-storing capacitor 7. In other words, when the data "HIGH" has been written in the memory cell 1, the potential of the bit line 36 is changed to a potential that is ΔV1 higher than the precharge potential VCC/2 as shown by the solid line in FIG. 3. As a result, the potential of the node 6 is changed to a potential that is ΔV2 higher than the potential VCC/2 as shown by the solid line in FIG. 3. On the other hand, when the data "LOW" has been written in the memory cell 1, the potential of the bit line 36 is changed to a potential that is ΔV1 lower than the precharge potential VCC/2 as shown by the broken line in FIG. 3. As a result, the potential of the node 6 is changed to a potential that is ΔV2 lower than the potential VCC/2 as shown by the broken line in FIG. 3.

At a timing t2 shown in FIG. 3, the potential of the signal SSA is raised from the ground potential GND to the power potential VCC. Because of this, the sense amplifier 21 amplifies the potential of the bit line 36 on the basis of a change in the potential of the signal SSA to read out the data. In more detail, when the data "HIGH" has been written in the memory cell 1, the sense amplifier 21 amplifies the potential of the bit line 36 to the power potential VCC as shown by the solid line in FIG. 3 to read out the data. On the other hand, when the data "LOW" has been written in the memory cell 1, the sense amplifier 21 amplifies the potential of the bit line 36 to the ground potential GND as shown by the broken line in FIG. 3 to read out the data. At this time, the sense amplifier 21 amplifies the potential of the bit line 37 in a manner so that the potential of the bit line 37 differs from that of the bit line 36.

At the timing t2, the potential of the node 6 is also changed. When the data "HIGH" has been written in the memory cell 1, the potential of the node 6 is changed to the power potential VCC as shown by the solid line in FIG. 3. When the data "LOW" has been written in the memory cell 1, the potential of the node 6 is changed to the ground potential GND as shown by the broken line in FIG. 3. This operation is referred to as a refresh operation.

At a timing t3 while the potential of the word line 38 is VPP, the potential of the first control signal SCP1 is raised from the ground potential GND to the power potential VCC. Because of this, the PMOS transistor 41 and the NMOS transistor 48 are turned on and the NMOS transistor 45 is turned off.

When the data "HIGH" has been written in the memory cell 1, the PMOS transistor 42 is turned off and the NMOS transistor 47 is turned on. Therefore, the node 14 is electrically conducted to the ground potential GND through the NMOS transistors 47 and 48 and its potential is changed to the potential as shown by the solid line in FIG. 3.

On the other hand, in the case where the data "LOW" has been written in the memory cell 1, the PMOS transistor 42 is turned on and the NMOS transistor 47 is turned off. The PMOS transistor 41 and the NMOS transistor 48 are also turned on and the NMOS transistor 45 is turned off since the first control signal SCP1 is "HIGH". Hence, the node 14 is electrically conducted to the power potential VCC through the PMOS transistors 41 and 42 and its potential is changed to the potential as shown by the broken line in FIG. 3.

At a timing t4 shown in FIG. 3, the potential of the word line 38 is dropped to the lower potential VS to turn off the NMOS transistor 5 of the memory cell 1.

At a timing t5 shown in FIG. 3, the potential of the first control signal SCP1 is changed to the ground potential GND. At this time, comparing with the condition at the timing t3 shown in FIG. 3, the PMOS transistor 41 is switched from on to off, the NMOS transistor 45 is switched from off to on and the NMOS transistor 48 is switched from on to off. As a result, the node 14 is electrically conducted to the line 52 through the NMOS transistors 45 and 46 and the potential of the node 14 becomes VCC/2 as shown in FIG. 3.

When the data "HIGH" has been written in the memory cell 1, the potential of the node 6 is raised to VCC+VCC/2 through the data-storing capacitor 7 as shown by the solid line in FIG. 3. Similarly, when the data "LOW" has been written in the memory cell 1, the potential of the node 6 is dropped to GND−VCC/2 through the data-storing capacitor 7 as shown by the broken line in FIG. 3.

In this example, the potential of the node 6 can be set at a potential that is VCC/2 higher than the potential VCC of the conventional example after an operation of reading out the data "HIGH" is completed. Alternatively, the potential of the node 6 can be set at a potential that is VCC/2 lower than the potential VCC of the conventional example after an operation of reading out the data "LOW" is completed.

Then, the potential of the signal SPR to be input to the precharge circuit 32 is dropped from the power potential VCC to the ground potential GND as shown in FIG. 3 to complete a series of operation of reading out data in the memory cell 1.

As shown in FIG. 3, the operation of reading out data from the memory cells 2–4 is not performed by setting the potential of the word lines 39–41 at the low potential VS and allowing the NMOS transistors 8, 10, and 12 to be off during the operation of writing data in the memory cell 1.

When it is intended to write data in any of the memory cells 2, 3, and 4, the data-readout operation is performed in the same procedures as in the case of the memory cell 1 if any one of the word lines 39, 40, and 41 and any one of the signals SCP1 and SCP2 are respectively allowed to work.

Each on/off condition of the transistors 41, 42, 45, 47, and 48 and the potential condition of the node 14 at the time of the data-writing operation and data-readout operation are as shown in the following Table 1.

TABLE 1

| SPC1 signal | SPC1 = VCC | | SPC1 = GND | |
|---|---|---|---|---|
| Data | Data = H | Data = L | Data = H | Data = L |
| Transistor 41 | ON | ON | OFF | OFF |
| Transistor 42 | OFF | ON | OFF | ON |
| Transistor 45 | OFF | OFF | ON | ON |
| Transistor 47 | ON | OFF | ON | OFF |
| Transistor 48 | ON | ON | OFF | OFF |
| Potential of node 14 | GND | Vcc | | Vcc/2 |

In the present invention, the potential of the node 6 can be made to be either the power potential VCC which is VCC/2 higher or the ground potential GND which is VCC/2 lower compared with the potential VCC/2 used in a conventional example after each of the data-writing operation and data-readout operation is completed. Therefore, variation in the potential of the bit line increases both in a readout operation after a writing operation and in a continuous readout operation.

In this example, a variation ΔV1 in the potential of the bit line is given by the following equation (4) or (5).

$$\Delta V1 = f(Cmc, Cbl) \times (Vcc + VCC/2 - VCC/2) \quad (4)$$

$$\Delta V1 = f(Cmc, Cbl) \times (GND - VCC/2 - VCC/2) \quad (5)$$

As is clear from the comparison of these equations (4) and (5) with the above equations (1) and (2) showing the variation ΔV1 in the potential of the bit line used in a conventional device, the variation AVI in the potential of the bit line in this example is twice as large as that of the conventional device.

This results in the noise immunity of the sense amplifier 21 being improved, thereby enabling a stable operation. Since the operational speed of the sense amplifier 21 is increased, high speed reading can be achieved. Moreover, even if the power voltage is reduced, a certain variation in the potential of the bit line is secured, thereby enabling an operation at low voltages in a semiconductor device.

The swing width of the potential when data is read out by the sense amplifier 21 increases with the potential of the node 6. Strict refresh characteristics (storing characteristics) after the data-readout operation are required when the data written in the memory cell 1 is "HIGH". Accordingly, the control by changing the potential of the node 14 after the data-writing or data-readout operation may be taken only when the data "HIGH" is written in the memory cell 1. Because of this, the transistors 41–44 arranged in the potential control circuit 40A and 40B can be omitted. This has the additional effect of improving the noise immunity of the sense amplifier 21 with increased data potential of the node 6. In this case, the lower potential VS to be set as the potential of the word line may be designed to be the ground potential GND.

In this example, the potential of the bit lines 36 and 37 is input to the potential control circuit 40, but the type of input is not limited to this. The data potential stored in the memory cell may be input to the potential control circuit 40. For example, a data-input signal and a data-output signal may be input to the potential control circuit 40 in the writing operation and in the readout operation respectively.

In this example, only a circuit area of a semiconductor memory device is described. However, the present invention can be applied to a semiconductor device comprising a semiconductor memory device.

Description of Semiconductor Structure

Figure 4:
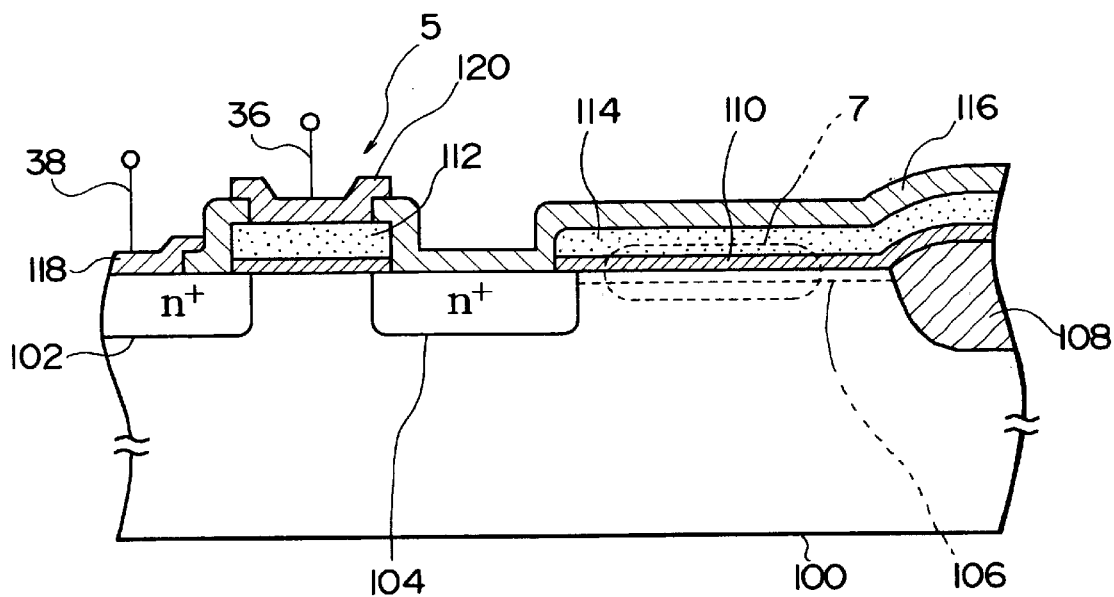
FIG. 4 is a schematic sectional view showing an embodiment of a semiconductor structure to which the present invention is applied.
Figure 5:
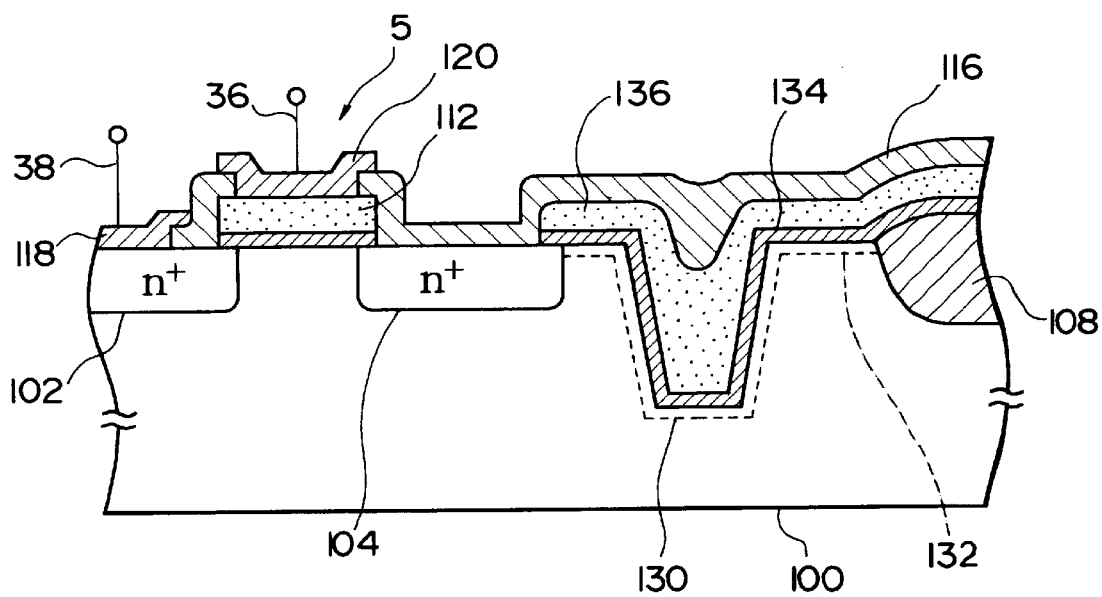
FIG. 5 is a schematic sectional view showing another embodiment of a semiconductor structure to which the present invention is applied.

FIGS. 4 and 5 are schematic sectional views showing two types of semiconductor structure to which the present invention is applied. FIG. 4 shows a stacked capacitor cell structure and FIG. 5 a trench capacitor cell structure.

In FIG. 4, a memory cell 1 comprising an NMOS transistor 5 and a data-storing capacitor 7 is formed on a p-type semiconductor substrate 100 of the semiconductor device. On the semiconductor substrate 100, $n^+$ diffused layers 102 and 104 as a source region and drain region of the NMOS transistor 5 respectively, an inversion layer 106 as a first electrode of the data-storing capacitor 7, and an element isolated region 108 are formed. An $SiO_2$ film 110 which also serves as a gate oxide film is formed on the semiconductor substrate 100. A polysilicon layer is formed on the $SiO_2$ film 110. From the polysilicon layer, a gate electrode 112 and an electrode layer 114 as a second electrode for the data-storing capacitor 7 are formed.

Accordingly, the data-storing capacitor 7 comprises the inversion layer 106, the $SiO_2$ film 110 and the electrode layer 114.

On the polysilicon layer, an insulated layer 116 is formed, and an electrode layer 118 connected to the bit line 36, and an electrode layer 120 connected to the word line 37 are also formed from a metal layer such as an aluminum layer.

When forming the memory cell 1 shown in FIG. 1, the electrode layer 114 as the second electrode (node 14) of the data-storing capacitor 7 is connected to the memory cells 2–4 connected to the bit lines 36 are 37, but the electrode layer 114 is insulated/isolated from the memory cells connected to other pairs of bit lines. This structure differs from that of the semiconductor memory device of FIG. 6 which is a conventional example. This is because each node 14 of all the memory cells is connected in common and the potential VCC/2 is always applied to the node 14 in the conventional semiconductor memory device shown in FIG. 6.

In the structure shown in FIG. 5, a memory cell 1 comprising an NMOS transistor 5 and a data-storing capacitor 7 is formed on a p-type semiconductor substrate 100.

The structure of FIG. 5 differs from that of FIG. 4 in that the data-storing capacitor 7 is formed in a trench 130. This data-storing capacitor 7 is provided with an inversion layer 132 which is formed as a first electrode along the trench 130, an $SiO_2$ layer 134 and an electrode layer 136 which is formed as a second electrode on the $SiO_2$ layer.

In the structure shown in FIG. 5, the electrode layer 136 as the second electrode (node 14) of the data-storing capacitor 7 is connected to the memory cells 2–4 connected to the bit lines 36, 37 but is insulated/isolated from memory cells connected to other pairs of bit lines.

Description of Electronic Instrument

An electronic instrument comprising a semiconductor device provided with the semiconductor memory device of the present invention enables operation at low voltages. Therefore, the present invention can be applied to various electronic instruments such as installed types of electronic instruments such as a personal computer using a semiconductor memory device as a memory. Moreover, the present invention can be applied to portable electronic instruments such as mobile computers and portable telephones, enabling small battery dissipation.

What is claimed is:

1. A semiconductor memory device comprising:
   a plurality of word lines;
   a plurality of bit line pairs;
   a plurality of memory cells, each of the memory cells being connected to one of the word lines and also to one of the bit line pairs;
   a plurality of potential-control circuits; and
   a plurality of sense amplifiers which amplify data read-out from the plurality of memory cells through the plurality of bit line pairs to output the amplified data;
   wherein each of the memory cells comprises:
      a transistor comprising a control electrode and two input/output electrodes, the control electrode being connected to one of the word lines, and one of the input/output electrodes being connected to a bit line of one of the bit line pairs; and
      a data-storing capacitor further comprising a first electrode and a second electrode, the first electrode being connected to the other of the input/output electrodes of the transistor, and the second electrode being connected to one of the potential control circuits;
   wherein each of the plurality of potential control circuits changes the potential of the second electrode of the data-storing capacitor in response to and based on data stored in a memory cell in the plurality of memory cells after data-writing and data-reading operations for the memory cell has been completed.

2. The semiconductor memory device as defined in claim 1, wherein each of the potential control circuits is provided for one group of memory cells among the plurality of memory cells, the one group of memory cells being commonly connected to one of the bit line pairs.

3. The semiconductor memory device as defined in claim 2, wherein after the potential of the second electrode has been changed and one of the word lines connected to the memory cell has been brought to an unselected condition, each of the potential control circuits returns a value of the potential of the second electrode to a value before the change.

4. The semiconductor memory device as defined in, claim 1, wherein each of the potential control circuits controls the potential of the second electrode of the data-storing capacitor only when the data stored in the memory cell is "HIGH".

5. The semiconductor memory device as defined in claim 1, wherein each of the potential control circuits controls the potential of the second electrode of the data-storing capacitor so that the value of the potential of the second electrode that is set when the data stored in the memory cell is "HIGH" is different from the value of the potential of the second electrode that is set when the data stored in the memory cell is "LOW".

6. The semiconductor memory device as defined in claim 4, wherein each of the potential control circuits sets the potential of the second electrode of the data-storing capacitor to be less than a given value when the data stored in the memory cell is "HIGH".

7. The semiconductor memory device as defined in claim 5, wherein each of the potential control circuits sets the potential of the second electrode of the data-storing capacitor to be higher than a given value when the data stored in the memory cell is "LOW".

8. The semiconductor memory device as defined in claim 6, wherein if a data potential at the time when the data stored in the memory cell is "HIGH" is a power potential VCC, and if a data potential at the time when the data stored in the memory cell is "LOW" is a ground potential GND, each of the potential control circuits sets the potential of the second electrode of the data-storing capacitor to be the ground potential GND after the writing and reading operations of the "HIGH" data for the memory cell have been completed; and wherein each of the potential control circuits sets the potential of the second electrode of the data-storing capacitor to be VCC/2 except when the writing and reading operations have been completed.

9. The semiconductor memory device as defined in claim 7, wherein if a data potential at the time when the data stored in the memory cell is "HIGH" is a power potential VCC, and if a data potential at the time when the data stored in the memory cell is "LOW" is a ground potential GND, each of the potential control circuits sets the potential of the second electrode of the data-storing capacitor to be the power potential VCC after the writing and reading operations of the "LOW" data for the memory cell have been completed; and wherein each of the potential control circuits sets the potential of the second electrode of the data-storing capacitor to be VCC/2 except when the writing and reading operations have been completed.

10. The semiconductor memory device as defined in claim 9, wherein a potential that is supplied to the control electrode of the transistor that is connected to one of the word lines is set to be less than $-VCC/2$ when the one of the word lines is not selected.

11. The semiconductor memory device as defined in claim 1, wherein each of the potential control circuits comprises:
a first switching circuit that is switched based on a control signal that becomes active after the writing and reading operations of data for the memory cell has been completed; and
a second switching circuit that is switched based on a data potential stored in the memory cell.

12. The semiconductor memory device as defined in claim 11, wherein the second switching circuit is connected to one of the bit line pairs.

13. The semiconductor memory device as defined in claim 1, wherein each of the plurality of memory cells has a stacked capacitor cell structure that is formed by stacking the first and second electrodes of the data-storing capacitor, and an insulating layer between the first and second electrodes.

14. The semiconductor memory device as defined in claim 1, wherein each of the plurality of memory cells has a trench capacitor cell structure that is formed by arranging the first electrode of the data-storing capacitor, an insulating layer, and the second electrode of the data-storing capacitor along a trench formed on a semiconductor substrate.

15. The semiconductor device wherein the semiconductor memory device as defined in claim 1 is formed on a semiconductor substrate.

16. An electronic instrument comprising at least the semiconductor device as defined in claim 15.

* * * * *

UNITED STATES PATENT AND TRADEMARK OFFICE
CERTIFICATE OF CORRECTION

PATENT NO. : 6,178,121 B1
DATED : January 23, 2001
INVENTOR(S) : Akira Maruyama

It is certified that error appears in the above-identified patent and that said Letters Patent is hereby corrected as shown below:

<u>Title page,</u>
After "PCT" Pub. Date: Jun. 17, 1999" and before "(51), insert:

-- (30)     Foreign Application Priority Data
Dec. 11, 1997 (JP) ...................................9-341088

Signed and Sealed this

Twenty-fifth Day of September, 2001

Attest:

NICHOLAS P. GODICI
*Attesting Officer*     *Acting Director of the United States Patent and Trademark Office*